US010955979B2

(12) United States Patent
Liang et al.

(10) Patent No.: US 10,955,979 B2
(45) Date of Patent: Mar. 23, 2021

(54) ARRAY SUBSTRATE AND DISPLAY PANEL

(71) Applicant: Huawei Technologies Co., Ltd., Shenzhen (CN)

(72) Inventors: Yanfeng Liang, Shanghai (CN); Chunlang Pu, Shanghai (CN); Kangjie Chao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/650,082

(22) PCT Filed: Jul. 31, 2018

(86) PCT No.: PCT/CN2018/097771
§ 371 (c)(1),
(2) Date: Mar. 24, 2020

(87) PCT Pub. No.: WO2019/056854
PCT Pub. Date: Mar. 28, 2019

(65) Prior Publication Data
US 2020/0241703 A1 Jul. 30, 2020

(30) Foreign Application Priority Data
Sep. 25, 2017 (CN) .......................... 201710887181.8

(51) Int. Cl.
*G06F 3/045* (2006.01)
*G06F 3/044* (2006.01)
*H01L 27/12* (2006.01)

(52) U.S. Cl.
CPC .......... *G06F 3/0445* (2019.05); *G06F 3/0446* (2019.05); *H01L 27/124* (2013.01); *G06F 2203/04111* (2013.01)

(58) Field of Classification Search
CPC ...... G06F 3/044; G06F 3/0445; G06F 3/0446; G06F 2203/04111; G06F 2203/04112; H01L 27/12; H01L 27/1214; H01L 27/124
See application file for complete search history.

(56) References Cited

U.S. PATENT DOCUMENTS

| 9,164,641 B1 | 10/2015 | Rowe |
| 2013/0076675 A1 | 3/2013 | Shin et al. |

(Continued)

FOREIGN PATENT DOCUMENTS

| CN | 103500039 A | 1/2014 |
| CN | 203552217 U | 4/2014 |

(Continued)

*Primary Examiner* — Joe H Cheng
(74) *Attorney, Agent, or Firm* — Conley Rose, P.C.

(57) ABSTRACT

An array substrate including a display area and a non-display area, where the non-display area includes a first gate driving circuit, a second gate driving circuit, a first touch driving circuit and a second touch driving circuit. An extension direction of the first gate driving circuit and an extension direction of the second gate driving circuit are perpendicular to an extension direction of gate lines. An extension direction of the first touch driving circuit and an extension direction of the second touch driving circuit are perpendicular to an extension direction of touch driving electrodes. The first touch driving circuit and the first gate driving circuit are disposed in series along a same direction, and the second touch driving circuit and the second gate driving circuit are disposed in series along a same direction.

20 Claims, 7 Drawing Sheets

(56) References Cited

U.S. PATENT DOCUMENTS

| | | | | |
|---|---|---|---|---|
| 2014/0192019 A1* | 7/2014 | Fukushima | ......... | G06F 3/04184 345/174 |
| 2015/0109548 A1* | 4/2015 | Kim | ....... | G06F 3/044 349/12 |
| 2015/0168788 A1* | 6/2015 | Song | ..... | G02F 1/1368 345/174 |
| 2015/0185938 A1* | 7/2015 | Han | ...... | G06F 3/0412 345/173 |
| 2015/0220194 A1 | 8/2015 | Lin et al. | | |
| 2015/0277657 A1* | 10/2015 | Azumi | ................ | G09G 3/3648 345/174 |
| 2015/0370381 A1* | 12/2015 | Mizuhashi | ........... | G06F 3/0446 345/174 |
| 2016/0195972 A1* | 7/2016 | Chen | ..... | G06F 3/0416 345/173 |
| 2018/0046048 A1* | 2/2018 | Zhao | ....... | G11C 19/28 |
| 2018/0348922 A1* | 12/2018 | Luo | ......... | G09G 3/20 |
| 2019/0155421 A1 | 5/2019 | Fukushima | | |
| 2019/0310728 A1* | 10/2019 | Yoshida | ................ | G06F 3/044 |
| 2020/0004090 A1* | 1/2020 | Yoshida | ............... | G02F 1/1368 |

FOREIGN PATENT DOCUMENTS

| | | |
|---|---|---|
| CN | 103927047 A | 7/2014 |
| CN | 105446544 A | 3/2016 |
| CN | 105609072 A | 5/2016 |
| CN | 106708320 A | 5/2017 |
| KR | 20140011622 A | 1/2014 |
| WO | 2015069048 A1 | 5/2015 |

\* cited by examiner

ARRAY SUBSTRATE AND DISPLAY PANEL

CROSS-REFERENCE TO RELATED APPLICATIONS

This application is a U.S. National Stage of International Patent Application No. PCT/CN2018/097771 filed on Jul. 31, 2018, which claims priority to Chinese Patent Application No. 201710887181.8 filed on Sep. 25, 2017. Both of the aforementioned applications are hereby incorporated by reference in their entireties.

TECHNICAL FIELD

The present application relates to the field of touch display technologies, and in particular, to an array substrate and a display panel.

BACKGROUND

With rapid development of display technologies, the birth of a touch panel (Touch Panel, TP for short) makes people's life more convenient. An embedded capacitive touchscreen integrates a touch electrode structure in a display screen, has advantages of a simple structure, a light weight, a thin thickness and low cost, increasingly becomes a mainstream technology of a touchscreen, and is increasingly widely applied to various portable intelligent terminals (such as mobile phones).

In an embedded capacitive touchscreen, the embedded capacitive touchscreen may be divided into a hybrid in-cell (Hybrid In-Cell, HIC for short) capacitive touchscreen and a full in-cell (Full In-Cell, FIC for short) capacitive touchscreen.

To make a bezel (a left bezel and a right bezel) narrower, in an FFIC capacitive touchscreen, on an array substrate, a touch driving electrode Tx is made to extend along a vertical direction, a touch driving circuit 10 driving the touch driving electrode Tx is disposed below (as shown in FIG. 1) or above the array substrate, so that only a gate driving circuit 11 is disposed on a side of the left and right bezel, thereby making the bezel narrower. A corresponding touch sensing electrode Rx on a box-aligning substrate extends along a horizontal direction (as shown in FIG. 2). However, because a line width of a leading wire 12 connected to the touch sensing electrode Rx is relatively thin, in production of a leading wire, scratching by a leading wire often occurs, thereby causing a TP ghost hand.

For an FIC capacitive touchscreen, both a touch driving electrode Tx and a touch sensing electrode Rx are located on an array substrate. When the touch driving electrode Tx extend along a horizontal direction, and the touch sensing electrode Rx extend along a vertical direction, because a gate driving circuit 11 and a touch driving circuit 10 are disposed in parallel on a side of a left bezel and a right bezel (as shown in FIG. 3), a bezel cannot be made narrower. When the touch driving electrode Tx is disposed along the vertical direction, and the touch sensing electrode Rx is disposed along the horizontal direction, scratching by a leading wire also occurs.

SUMMARY

This application provides an array substrate and a display panel, which can implement a narrow bezel, and can avoid scratching by a leading wire.

According to a first aspect, an array substrate is provided, including a substrate, where a display area and a non-display area are disposed on the substrate; the display area includes a first gate line group and a second gate line group, both the first gate line group and the second gate line group include a plurality of gate lines arranged along a first direction, and an extension direction of the gate lines intersects with the first direction; the display area further includes a first touch driving electrode group and a second touch driving electrode group, both the first touch driving electrode group and the second touch driving electrode group include a plurality of touch driving electrodes arranged along the first direction, and an extension direction of the touch driving electrodes intersects with the first direction; the non-display area includes a first gate driving circuit and a second gate driving circuit, the first gate driving circuit and the second gate driving circuit are respectively disposed on two sides of the gate lines, the first gate driving circuit is configured to drive the first gate line group, and the second gate driving circuit is configured to drive the second gate line group; and the non-display area further includes a first touch driving circuit and a second touch driving circuit, where the first touch driving circuit and the first gate driving circuit are located on a same side and are disposed along the first direction, the second touch driving circuit and the second gate driving circuit are located on a same side and disposed along the first direction, the first touch driving circuit is configured to drive the first touch driving electrode group, and the second touch driving circuit is configured to drive the second touch driving electrode group. By dividing all gate lines into a first gate line group and a second gate line group, dividing all touch driving electrodes into a first touch driving electrode group and a second touch driving electrode group, disposing a first gate driving circuit that drives the first gate line group and a first touch driving circuit that drives the first touch driving electrode group in a non-display area on a same side of the gate lines, and making the first gate driving circuit and the first touch driving circuit arranged up and down along a first direction, and similarly, by disposing a second gate driving circuit that drives the second gate line group and a second touch driving circuit that drives the second touch driving electrode group in a non-display area on another side of the gate lines, and making the second touch driving circuit and the second gate driving circuit arranged up and down along the first direction, a width of a non-display area may be reduced, so that a display device may be made into a structure with a left and right narrow bezel. Based on this, because touch sensing electrodes are arranged along a second direction, that is, the touch sensing electrodes may extend in a Y direction along the first direction, in the prior art, scratching caused by a leading wire can be avoided.

With reference to the first aspect, in a first possible implementation of the first aspect, in the first gate line group and the second gate line group, a difference between quantities of the gate lines is less than or equal to 1. In a first gate line group and a second gate line group, by making a difference between quantities of gate lines less than or equal to 1, when a first gate driving circuit and a second gate driving circuit are formed, widths of non-display areas occupied by the first gate driving circuit and the second gate driving circuit on two sides of the gate lines may be consistent, so that bezel widths on the two sides of the gate lines may be consistent, and based on an aesthetic, it is more conducive to implement a narrow bezel.

With reference to the first aspect, in a second possible implementation of the first aspect, in the first touch driving electrode group and the second touch driving electrode group, a difference between quantities of the touch driving electrodes is less than or equal to 1. In a first touch driving electrode group and a second touch driving electrode group, by making a difference between quantities of touch driving electrodes less than or equal to 1, when a first touch driving circuit and a second touch driving circuit are formed, it may be ensured that a width of a non-display area occupied by the first touch driving circuit is less than or equal to a width of a non-display area occupied by a first gate driving circuit, and a width of a non-display area occupied by the second touch driving circuit is less than or equal to a width of a non-display area occupied by a second gate driving circuit, so that after introducing the first touch driving circuit and the second touch driving circuit, an increase of bezel widths on two sides of gate lines can be avoided.

With reference to any one of the first aspect to the second possible implementation of the first aspect, in a third possible implementation of the first aspect, a quantity of all of the gate lines is M, and M is a positive integer greater than 1; the first gate line group includes N consecutive gate lines calculated from one of the gate lines closest to a first side of the substrate, N<M, and N is a positive integer greater than or equal to 1; the second gate line group includes remaining gate lines; the first gate driving circuit is disposed close to the first gate line group, and the second gate driving circuit is disposed close to the second gate line group; a quantity of all of the touch driving electrodes is P, and P is a positive integer greater than 1; the first touch driving electrode group includes Q consecutive gate lines calculated from one of the touch driving electrodes closest to a second side of the substrate, Q<P, and Q is a positive integer greater than and equal to 1; the second touch driving electrode group includes remaining touch driving electrodes; the first touch driving circuit is disposed close to the first touch driving electrode group, and the second touch driving circuit is disposed close to the second touch driving electrode group; and the first side and the second side are two opposite sides along the first direction. Based on a division manner of a first gate line group and a second gate line group, and a division manner of a first touch driving electrode group and a second touch driving electrode group described above, and by disposing a first gate driving circuit close to the first gate line group, disposing a second gate driving circuit close to the second gate line group, disposing a first touch driving circuit close to the first touch driving electrode group, and disposing a second touch driving circuit close to the second touch driving electrode group, complexity of wiring of the first gate driving circuit, the second gale driving circuit, the first touch driving circuit, and the second touch driving circuit can be avoided, so that performance and yield of a product can be improved.

With reference to the first aspect, in a fourth possible implementation of the first aspect, a shape of the touch driving electrodes is a strip shape.

With reference to any one of the first aspect to the fourth possible implementation of the first aspect, in a fifth possible implementation of the first aspect, the display area further includes a common electrode, and the touch driving electrodes are multiplexed with the common electrode, so that process is simplified.

With reference to any one of the first aspect to the fourth possible implementation of the first aspect, in a sixth possible implementation of the first aspect, the display area further includes a plurality of touch sensing electrodes arranged along a second direction, where an extension direction of the touch sensing electrodes intersects with the second direction; and the first direction intersects with the second direction.

With reference to the sixth impossible implementation of the first aspect, in a seventh possible implementation of the first aspect, the display area further includes a common electrode, and the touch driving electrodes or the touch sensing electrodes are multiplexed with the common electrode.

With reference to the sixth possible implementation of the first aspect, in an eighth possible implementation of the first aspect, both the gate lines and the touch driving electrodes extend along the second direction; and both the touch sensing electrodes and data lines extend along the first direction.

According to a second aspect, a display panel is provided, including any array substrate in the first aspect to the eighth possible implementation of the first aspect.

According to a third aspect, another display panel is provided, including an array substrate, and a box-aligning substrate meshed with the array substrate together, where the array substrate includes: a substrate, where a display area and a non-display area are disposed on the substrate; the display area includes a first gate line group and a second gate line group, where both the first gate line group and the second gate line group include a plurality of gate lines arranged along a first direction, and an extension direction of the gate lines intersects with the first direction; the display area further includes a first touch driving electrode group and a second touch driving electrode group, where both the first touch driving electrode group and the second touch driving electrode group include a plurality of touch driving electrodes arranged along the first direction, and an extension direction of the touch driving electrodes intersects with the first direction; the non-display area includes a first gate driving circuit and a second gate driving circuit, where the first gate driving circuit and the second gate driving circuit are respectively disposed on two sides of the gate lines, the first gate driving circuit is configured to drive the first gate line group, and the second gate driving circuit is configured to drive the second gate line group; and the non-display area further includes a first touch driving circuit and a second touch driving circuit, where the first touch driving circuit and the first gate driving circuit are located on a same side and are disposed along the first direction, the second touch driving circuit and the second gate driving circuit are located on a same side and are disposed along the first direction, the first touch driving circuit is configured to drive the first touch driving electrode group, and the second touch driving circuit is configured to drive the second touch driving electrode group; and a plurality of touch sensing electrodes arranged along a second direction X are disposed on an area of a display area of the array substrate corresponding to the box-aligning substrate, and an extension direction of the touch sensing electrodes intersects with the second direction; and the first direction intersects with the second direction.

With reference to the third aspect, in a first possible implementation of the third aspect, the touch sensing electrodes are in a grid structure, and material of the touch sensing electrodes is metal material. In this way, conductivity of a touch sensing electrode may be made bet and touch performance is better.

REFERENCE SIGNS OF THE ACCOMPANYING DRAWINGS

10—touch driving circuit; 11—gate driving circuit; 12—first leading wire; 20—substrate; 30—display area; 31—first gate line group; 32—second gate line group; 312—gate line; 33—first touch driving electrode group; 34—second touch driving electrode group; 35—data line; 36—sub-pixel area; 40—non-display area; 41—first gate driving circuit; 42—second gate driving circuit; 43—first touch driving circuit; 44—second touch driving circuit; Rx—touch sensing electrode; Tx—touch driving electrode; X—second direction; Y—first direction.

DESCRIPTION OF EMBODIMENTS

Figure 1:
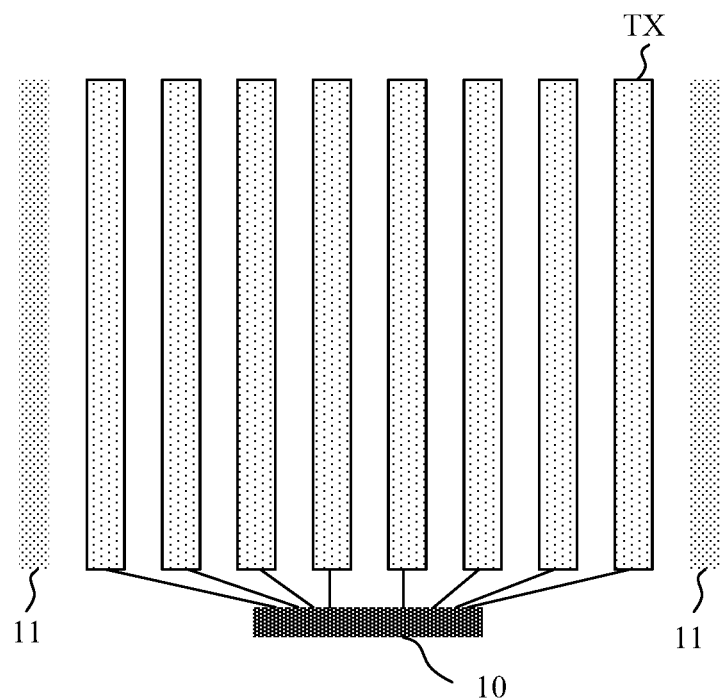
FIG. 1 is a schematic diagram of a setting mode of touch driving electrodes, a touch driving circuit and a gate driving circuit on an array substrate according to a prior art.
Figure 2:
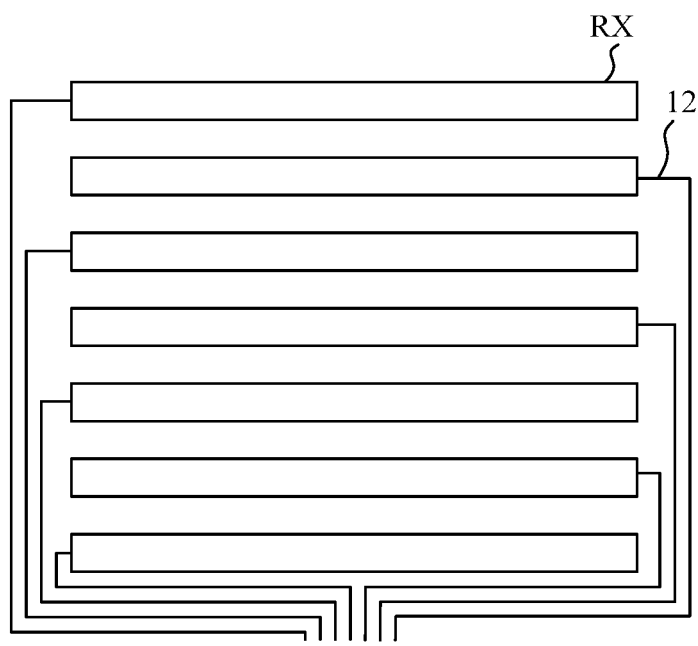
FIG. 2 is a schematic diagram of touch sensing electrodes and leading wires connected to the touch sensing electrodes on a box-aligning substrate according to a prior art.
Figure 3:
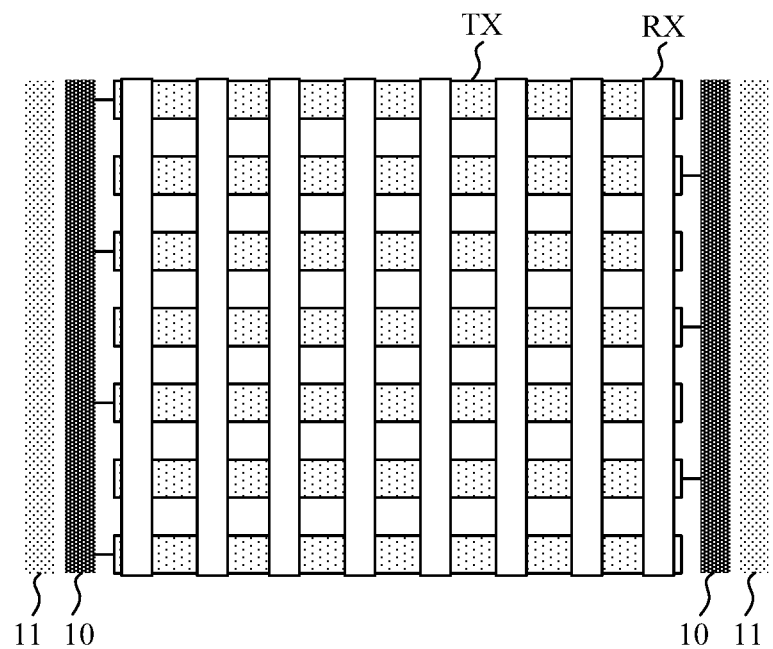
FIG. 3 is a schematic diagram of a setting mode of touch driving electrodes, touch sensing electrodes, a touch driving circuit and a gate driving circuit on an array substrate according to a prior art.
Figure 4A:
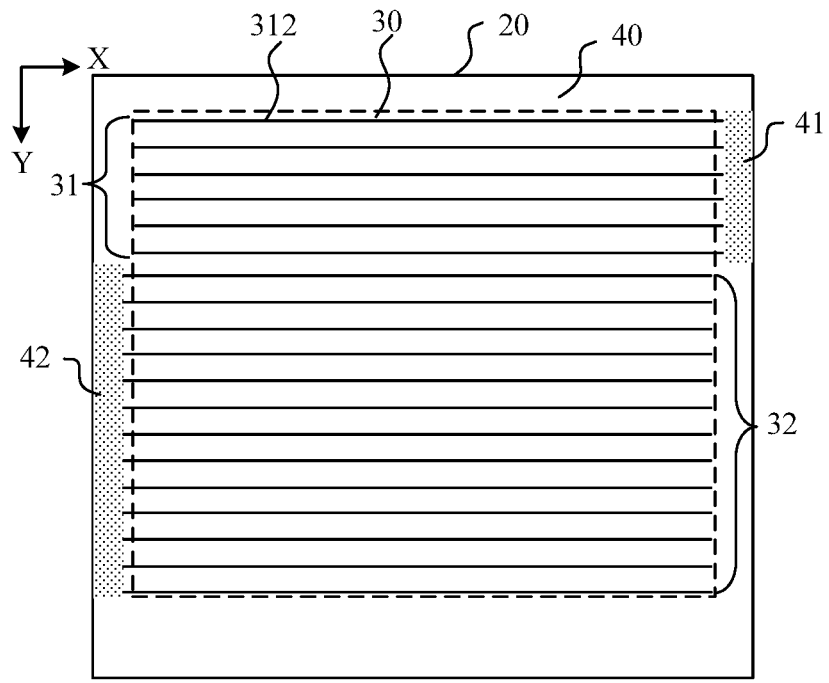
FIG. 4a is a schematic diagram 1 of a setting mode of gate lines, a first gate driving circuit and a second gate driving circuit on an array substrate according to this application.
Figure 4B:
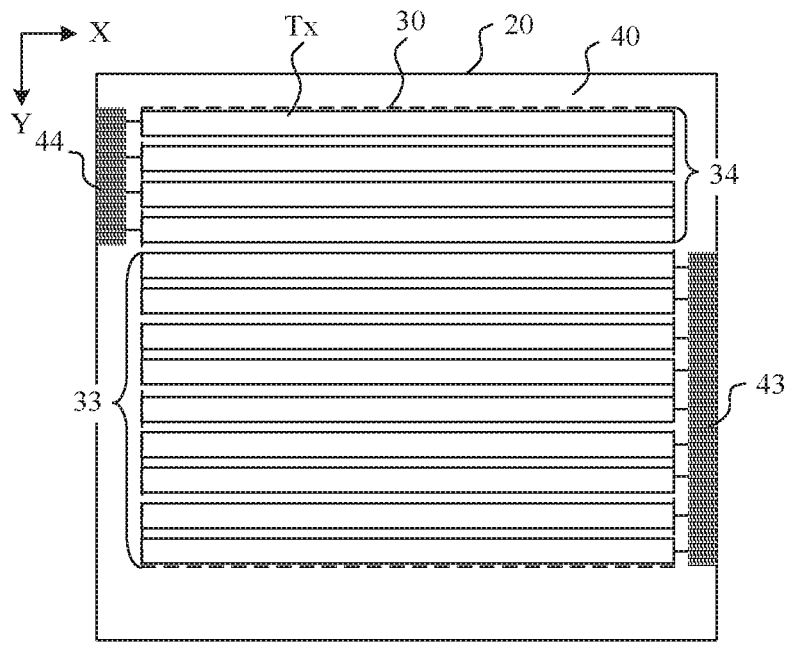
FIG. 4b is a schematic diagram 1 of a setting mode of touch driving electrodes, a first touch driving circuit and a second touch driving circuit on an array substrate according to this application.
Figure 4C:
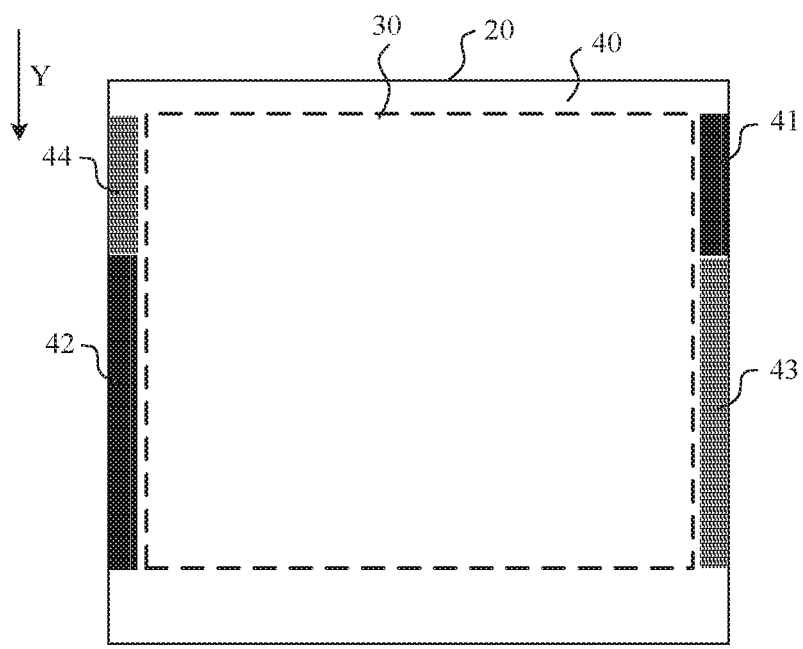
FIG. 4c is a schematic diagram 1 of a setting mode of a first gate driving circuit, a second gate driving circuit, a first touch driving circuit and a second touch driving circuit on an array substrate according to this application.

This application provides an array substrate, as shown in FIG. 4a to FIG. 4c, including a substrate 20, where a display area 30 and a non-display area 40 are disposed on the substrate 20; the display area 30 includes a first gate line group 31 and a second gate line group 32, both the first gate line group 31 and the second gate line group 32 include a plurality of gate lines 312 (only shown in FIG. 4a) arranged along a first direction Y, and an extension direction of the gate lines 312 intersects with the first direction Y; the display area 30 further includes a first touch driving electrode group 33 and a second touch driving electrode group 34, both the first touch driving electrode group 33 and the second touch driving electrode group 34 include a plurality of touch driving electrodes Tx (only shown in FIG. 4b) arranged along the first direction Y and an extension direction of the touch driving electrodes Tx intersects with the first direction; the non-display area 40 includes a first gate driving circuit 41 and a second gate driving circuit 42, the first gate driving circuit 41 and the second gate driving circuit 42 are respectively disposed on two sides of the gate lines 312, the first gate driving circuit 41 is configured to drive the first gate line group 31, and the second gate driving circuit 42 is configured to drive the second gate line group 32; and the non-display area 40 further includes a first touch driving circuit 43 and a second touch driving circuit 44, where the first touch driving circuit 43 and the first gate driving circuit 41 are located on a same side and are disposed along the first direction Y, the second touch driving circuit 44 and the second gate driving circuit 42 are located on a same side and disposed along the first direction Y, the first touch driving circuit 43 is configured to drive the first touch driving electrode group 33, and the second touch driving circuit 44 is configured to drive the second touch driving electrode group 34.

Figure 5:
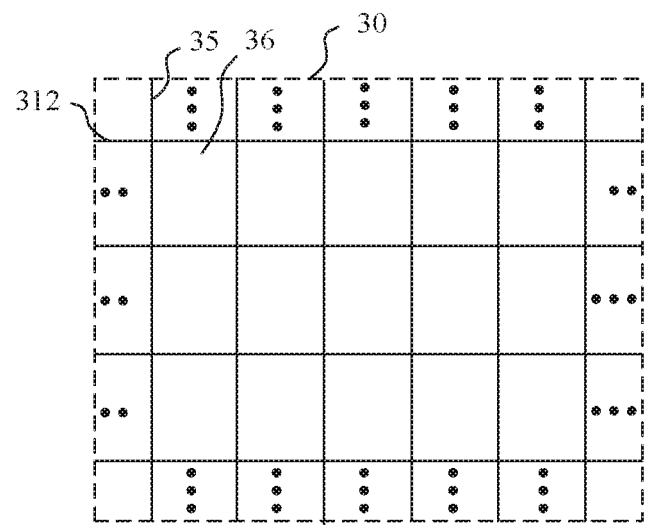
FIG. 5 is a schematic diagram of a sub-pixel area in a display area on an array substrate according to this application.

In addition, as shown in FIG. 5, the array substrate further includes data lines 35 in the display area 30, and the gate lines 312 and the data lines 35 intersect to define the sub-pixel area 36, where the sub-pixel area 36 is provided with a display structure.

Figure 6:
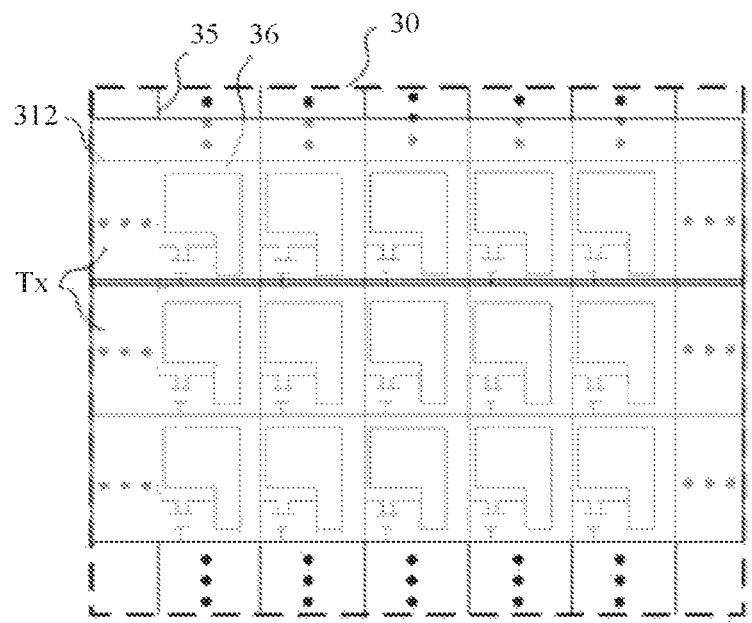
FIG. 6 is a schematic diagram of a display structure and touch driving electrodes disposed in a display area on an array substrate according to this application.

When the array substrate is applied to a liquid crystal display (Liquid Crystal Display, LCD for short), a transistor and a pixel electrode may be disposed on the sub-pixel area 36. For example, as shown in FIG. 6, a switching transistor and a pixel electrode may be disposed on the sub-pixel area 36; and a gate electrode of the switching transistor is electrically connected to a gate line 312, a first pole is electrically connected to a data line 35, a second pole is electrically connected to a pixel electrode, and the first electrode and the second electrode are mutual source electrode and drain electrode. Furthermore, a common electrode may be further disposed on the sub-pixel area 36. Certainly, a common electrode may also be disposed on a box-aligning substrate meshed with the array substrate together. The pixel electrode and the common electrode jointly act to drive liquid crystal to deflect, so that light transmission amount of each sub-pixel is controlled.

When a common electrode is disposed on the array substrate, a touch driving electrode Tx may be multiplexed with the common electrode. To be specific, in a display phase, a common voltage signal is provided to the touch driving electrode Tx, to make the touch driving electrode Tx function as a common electrode; and in a touch phase, a touch driving signal is provided to the touch driving electrode Tx, to make the touch driving electrode Tx and the touch sensing electrode function together to identify a touch location.

When the array substrate is applied to an Organic Light-Emitting Diode (Organic Light-Emitting Diode, OLED for short) display device, a driving circuit or a light emitting element may be disposed on the sub-pixel area 36. For example, the driving circuit on the sub-pixel area 36 may include a switching transistor and a driving transistor, where a gate electrode of the switching transistor is electrically connected to the gate line 312, a first pole is electrically connected to the data line 35, a second pole is electrically connected to a gate electrode of the driving transistor, a first pole of the driving transistor is electrically connected to a high voltage end, and a second pole is electrically connected to the light emitting element, where the light emitting element may include a cathode and an anode, the second pole of the driving transistor may be electrically connected to the anode, and the cathode is electrically connected to a low voltage end. Certainly, for the driving circuit, the driving circuit may further include a capacitor. Furthermore, the driving circuit may further include a threshold compensation circuit. Details are not described herein again.

When the array substrate is applied to a display device of another type, the sub-pixel area 36 may be provided with a corresponding structure based on an actual situation.

It should be noted that, a person skilled in the art knows that when a touch driving electrode TX is disposed on an array substrate, to identify a touch location, it is necessary to include a plurality of touch sensing electrodes arranged along a second direction, where an extension direction of the touch sensing electrodes intersects with the second direction, and the second direction intersects with a first direction Y. In this application, a touch sensing electrode may be disposed on an array substrate, or may be disposed on a box-aligning substrate meshed with the array substrate together. This is not limited herein.

To ensure accuracy of an identification of the touch location, the touch driving electrode Tx may be disposed in parallel with the gate line 312, that is, both the gate line 312 and the touch driving electrode Tx extend along a second direction X; and the touch sensing electrode may be disposed in parallel with the data line 35, that is, the data line 35 and the touch sensing electrode extend along a first direction Y. The second direction X may be a horizontal direction, and the first direction Y may be a vertical direction.

A principle of identifying the touch location by the touch driving electrode Tx and the touch sensing electrode is: the touch driving electrode Tx inputs a touch driving signal line by line; the touch sensing electrode receives an induction signal; and when touch occurs, at a touch location, a capacitor between the touch driving electrode Tx and the touch sensing electrode may change, so that the touch location is determined based on different signals received by the touch sensing electrode.

When the touch sensing electrode is disposed on the array substrate, the touch driving electrode Tx or the touch sensing electrode may be multiplexed with the common electrode.

A shape of the touch driving electrode Tx is a strip shape, to simplify manufacturing process.

The first gate driving circuit 41 and the second gate driving circuit 42 may be obtained at the same time when the transistor on the sub-pixel area is manufactured. The array substrate includes a great number of gate lines 312, and all of the gate lines 312 of this application are divided into two groups, that is, the first gate line group 31 and the second gate line group 32, where gate lines 312 in the first gate line group 31 are driven by the first gate driving circuit 41, and gate lines 312 in the second gate line group 32 are driven by the second gate driving circuit 42, so that from a first line, all of the gate lines 312 scan line by line.

Compared with bonding an integrated circuit (Integrated Circuit, IC for short) driving the gate lines 312 on the array substrate, integrating gate driving circuits on the array substrate (Gate on Array) is more conducive to implement a narrow bezel, where the gate driving circuits include the first gate driving circuit 41 and the second gate driving circuit 42.

When all of the gate lines 312 are divided into groups, in the first gate line group 31 and the second gate line group 32, a difference between quantities of the gate lines 312 may be less than or equal to 1.

Figure 7A:
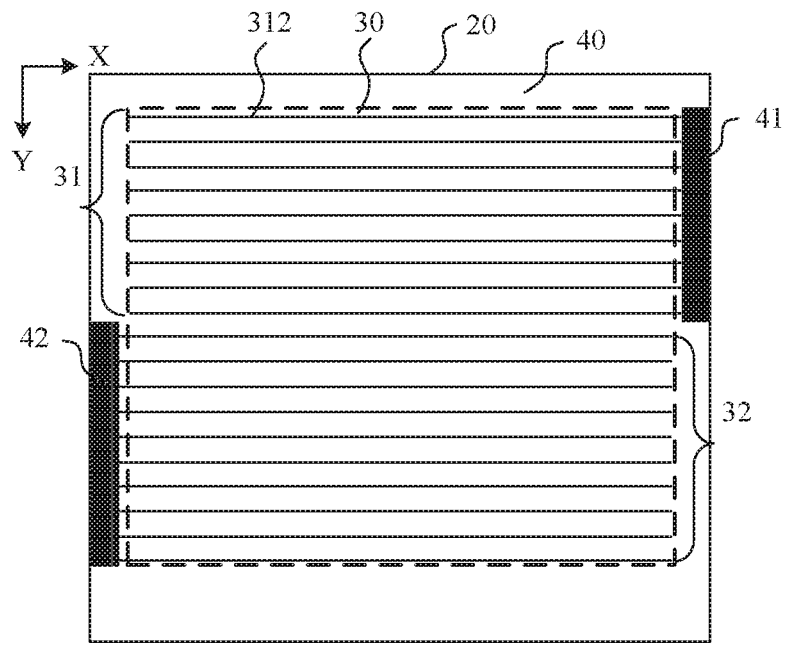
FIG. 7a is a schematic diagram 2 of a setting mode of gate lines, a first gate driving circuit and a second gate driving circuit on an array substrate according to this application.
Figure 7B:
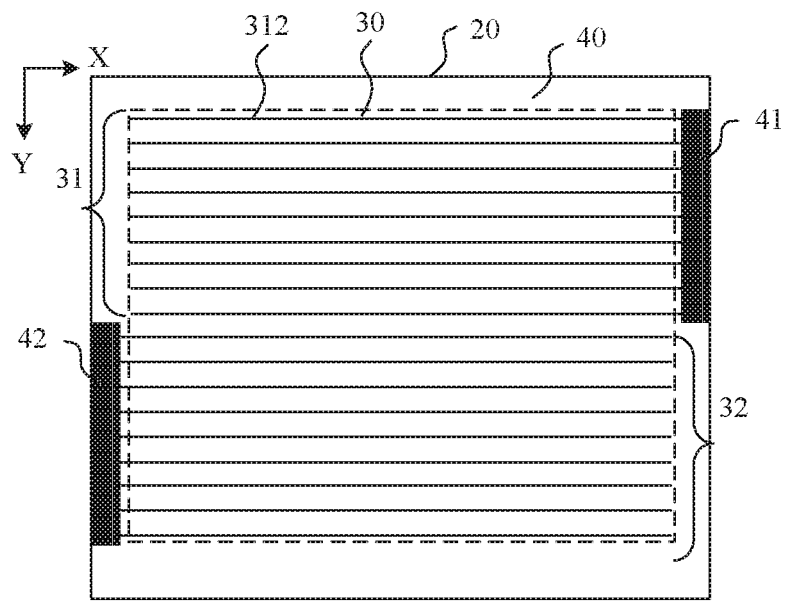
FIG. 7b is a schematic diagram 3 of a setting mode of gate lines, a first gate driving circuit and a second gate driving circuit on an array substrate according to this application.

To be specific, as shown in FIG. 7a, when the quantity of all of the gate lines 312 is an odd number, in the first gate line group 31 and the second gate line group 32, the difference between the quantities of the gate lines 312 may be equal to 1; and as shown in FIG. 7b, when the quantity of all of the gate lines 312 is an even number, in the first gate line group 31 and the second gate line group 32, the difference between the quantities of the gate lines 312 may be equal to 0.

In the first gate line group 31 and the second gate line group 32, by making the difference between the quantities of the gate lines 312 less than or equal to 1, when the first gate driving circuit 41 and the second gate driving circuit 42 are formed, widths of non-display areas 40 occupied by the first gate driving circuit 41 and the second gate driving circuit 42 on two sides of the gate lines 312 may be consistent, so that bezel widths on the two sides of the gate lines 312 may be consistent, and based on an aesthetic, it is more conducive to implement a narrow bezel.

In a case in which all of the gate lines 312 are divided into the two groups, all of the touch driving electrodes TX of this application are divided into two groups, that is, the first touch driving electrode group 33 and the second touch driving electrode group 34, where touch driving electrodes TX in the first touch driving electrode group 33 are driven by the first touch driving circuit 43, and touch driving electrodes TX in the second touch driving electrode group 34 are driven by the second touch driving circuit 44, from a first line, all of the touch driving electrodes TX scan line by line.

When all of the touch driving electrodes Tx are divided into groups, in the first touch driving electrode group 33 and the second touch driving electrode group 34, a difference between quantities of the touch driving electrode Tx may be less than or equal to 1.

Figure 7C:
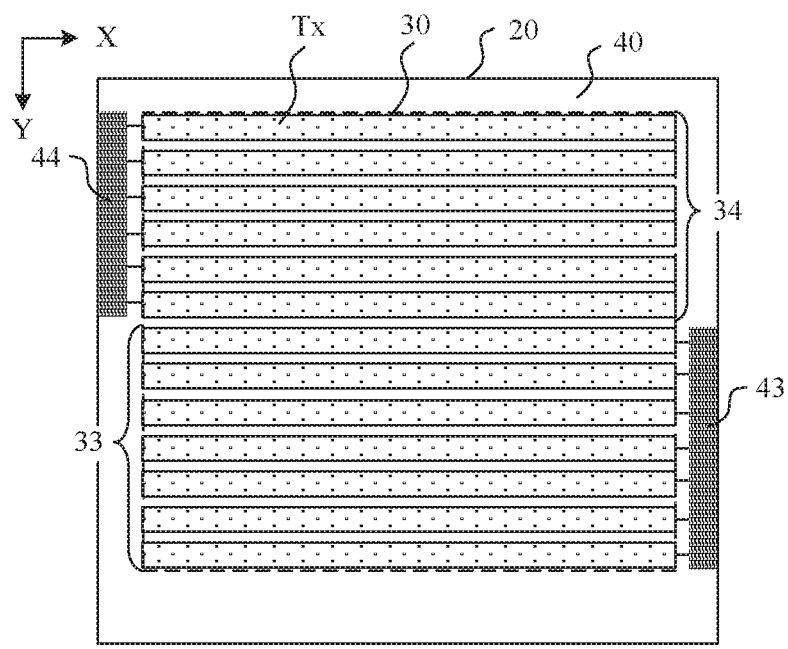
FIG. 7c is a schematic diagram 3 of a setting mode of touch driving electrodes, a first touch driving circuit and a second touch driving circuit on an array substrate according to this application.
Figure 7D:
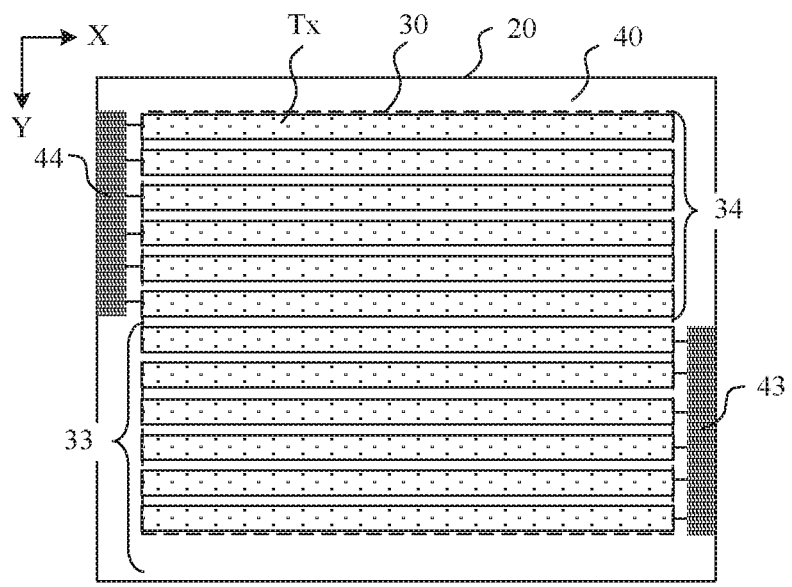
FIG. 7d is a schematic diagram 3 of a setting mode of touch driving electrodes, a first touch driving circuit and a second touch driving circuit on an array substrate according to this application.

To be specific, as shown in FIG. 7c, when the quantity of all of the touch driving electrodes Tx is an odd number, in the first touch driving electrode group 33 and the second touch driving electrode group 34, the difference between the quantities of the touch driving electrodes Tx may be equal to 1; and as shown in FIG. 7d, when the quantity of all of the touch driving electrodes Tx is even number, in the first touch driving electrode group 33 and the second touch driving electrode group 34, the difference between the quantities of the touch driving electrodes Tx may be equal to 0.

In the first touch driving electrode group 33 and the second touch driving electrode group 34, by making the difference between the quantities of the touch driving electrodes Tx less than or equal to 1, when the first touch driving circuit 43 and the second touch driving circuit 44 are formed, it may be ensured that a width of a non-display area 40 occupied by the first touch driving circuit 43 is less than or equal to a width of a non-display area 40 occupied by the first gate driving circuit 41, and a width of a non-display area 40 occupied by the second touch driving circuit 44 is less than or equal to a width of a non-display area 40 occupied by the second gate driving circuit 42, so that after introducing the first touch driving circuit 43 and the second touch driving circuit 44, an increase of bezel widths on two sides of gate lines 312 can be avoided.

t should be noted that, the first touch driving circuit 43 and the first gate driving circuit 41 are located on a same side, and both the first touch driving circuit 43 and the first gate driving circuit 41 are disposed along the first direction Y To be specific, in the non-display area 40 on a side of the gate lines 312 where the first touch driving circuit 43 and the first gate driving circuit 41 are located, the first touch driving circuit 43 and the first gate driving circuit 41 are arranged up and down along the first direction Y (that is, the first touch driving circuit 43 is used as a whole, the first gate driving circuit 41 is used as a whole, and both the first touch driving circuit 43 and the first gate driving circuit 41 are disposed in series along the first direction Y), When the first gate driving circuit 41 is disposed above, the first touch driving circuit 43 is disposed below the first gate driving circuit 41; and when the first touch driving circuit 43 is disposed above, the first gate driving circuit 41 is disposed below the first touch driving circuit 43.

Similarly, the second touch driving circuit 44 and the second gate driving circuit 42 are located on a same side, and both the second touch driving circuit 44 and the second gate driving circuit 42 are disposed along the first direction Y. To be specific, in the non-display area 40 on a side of the gate lines 312 where the second touch driving circuit 44 and the second gate driving circuit 42 are located, the second touch driving circuit 44 and the second gate driving circuit 42 are arranged up and down along the first direction Y (that is, the second touch driving circuit 44 is used as a whole, the second gate driving circuit 42 is used as a whole, and both the second touch driving circuit 44 and the second gate driving circuit 42 are disposed in series along the first direction Y). When the second touch driving circuit 44 is disposed above, the second gate driving circuit 42 is disposed below the second touch driving circuit 44; and when the second gate driving circuit 42 is disposed above, the second touch driving circuit 44 is disposed below the second gate driving circuit 42.

Based on the above, the quantity of all of the gate lines 312 may be M, and M is a positive integer greater than 1; the first gate line group 31 includes consecutive N gate lines calculated from one of the gate lines 312 closest to a first side of the substrate 20, N<M, and N is a positive integer greater than or equal to 1; the second gate line group 32 includes remaining gate lines 312; and based on this, the first gate driving circuit 41 is disposed close to the first gate line group 31, and the second gate driving circuit 42 is disposed close to the second gate line group 32.

For example, a gate line 312 closest to the first side of the substrate 20 may be denoted as a first gate line 312, and later gate lines 312 are sequentially denoted as a second gate line 312, a third gate line 312, . . . , and an $M^{th}$ gate line 312; when M is an odd number, the first to $(M-1)/2^{th}$ gate lines 312 may be used as gate lines 312 in the first gate line group 31, and a $((M-1)/2)+1^{th}$ to $M^{th}$ gate lines 312 may be used as gate lines 312 in the second gate line group 32; or the first to $(M+1)/2^{th}$ gate lines 312 may be used as gate lines 312 in the first gate line group 31, and a $((M+1)/2)+1^{th}$ to $M^{th}$ gate lines 312 may be used as gate lines 312 in the second gate line group 32; and when M is an even number, the first to $M/2^{th}$ gate lines 312 may be used as gate lines 312 in the first gate line group 31, and a $(M/2)+1^{th}$ to $M^{th}$ gate lines 312 may be used as gate lines 312 in the second gate line group 32.

Furthermore, the quantity of all of the touch driving electrodes Tx is P, and P is a positive integer greater than 1; the first touch driving electrode group 33 includes Q consecutive touch driving electrodes Tx calculated from one of the touch driving electrodes Tx closest to a second side of the substrate, Q<P, and Q is a positive integer greater than and equal to 1; the second touch driving electrode group 34 includes remaining touch driving electrodes Tx; the first touch driving circuit 43 is disposed close to the first touch driving electrode group 33, and the second touch driving circuit 44 is disposed close to the second touch driving electrode group 34; and a first side and a second side of the substrate 20 are two opposite sides along the first direction.

For example, a touch driving electrode Tx closest to the first side of the substrate 20 may be denoted as a first touch driving electrode Tx, and later touch driving electrodes Tx are sequentially denoted as a second touch driving electrode Tx, a third touch driving electrode Tx, . . . , and a $P^{th}$ touch driving electrode Tx, and the $P^{th}$ touch driving electrode Tx is close to the second side of the substrate 20; when P is an odd number, the first to $(P-1)/2^{th}$ touch driving electrodes may be used as touch driving electrodes Tx in the second touch driving group 34, and a $((P-1)/2)+1^{th}$ to $P^{th}$ touch driving electrodes Tx may be used as touch driving electrodes Tx in the first touch driving electrode group 33; or the first to $(P+1)/2^{th}$ touch driving electrodes Tx may be used as touch driving electrodes in the second driving electrode group 34, and a $((P+1)/2)+1^{th}$ to $P^{th}$ touch driving electrodes Tx may be used as touch driving electrodes Tx in the first touch driving electrode group 33; and when P is an even number, the first to $P/2^{th}$ touch driving electrodes may be used as touch driving electrodes Tx in the second driving electrode group 34, and a $(P/2)+1^{th}$ to $P^{th}$ touch driving electrodes Tx may be used as touch driving electrodes Tx in the first touch driving electrode group 33.

Based on a division manner of the first gate line group 31 and the second gate line group 32, and a division manner of the first touch driving electrode group 33 and the second touch driving electrode group 34 described above, and by disposing the first gate driving circuit 41 close to the first gate line group 31, disposing the second gate driving circuit 42 close to the second gate line group 32, disposing the first touch driving circuit 43 close to the first touch driving electrode group 33, and disposing the second touch driving circuit 44 close to the second touch driving electrode group 34, complexity of wiring of the first gate driving circuit 41, the second gate driving circuit 42, the first touch driving circuit 43, and the second touch driving circuit 44 can be avoided, so that performance and yield of a product can be improved.

Based on the foregoing description, a display chip may be bonded on the array substrate. The display chip is connected to the data lines 35, the first gate driving circuit 41, and the second gate driving circuit 42, and is configured to control display.

A touch control chip may be disposed on a circuit card. The touch control chip is connected to touch sensing electrodes Rx, the first touch driving circuit 43, the second touch driving circuit 44, and is configured to control touch. By making the first touch driving circuit 43 and the second touch driving circuit 44 on the array substrate, the touch control chip can be made extremely simple, thereby reducing cost.

According to the array substrate provided in this application, by dividing all of the gate lines 312 into the first gate line group 31 and the second gate line group 32, dividing all of the touch driving electrodes Tx into the first touch driving electrode group 33 and the second touch driving electrode group 34, disposing the first gate driving circuit 41 that drives the first gate line group 31 and the first touch driving circuit 43 that drives the first touch driving electrode group 33 in a non-display area 40 on a same side of the gate lines 312, and making the first gate driving circuit 41 and the first touch driving circuit 43 arranged up and down along the first direction Y. and similarly, by disposing the second gate driving circuit 42 that drives the second gate line group 32 and the second touch driving circuit 44 that drives the second touch driving electrode group 34 in a non-display area 40 on another side of the gate lines 312, and making the second touch driving circuit 44 and the second gate driving circuit 42 arranged up and down along the first direction Y, a width of a non-display area 40 may be reduced, so that when the array substrate is applied to a display device, the display device may be made into a structure with a left and right narrow bezel. Based on this, because the touch sensing electrodes Rx are arranged along the second direction X, that is, the touch sensing electrodes Rx may extend along the first direction Y in the prior art, scratching caused by a leading wire can be avoided.

This application further provides a display panel, including the foregoing array substrate.

Figure 8:
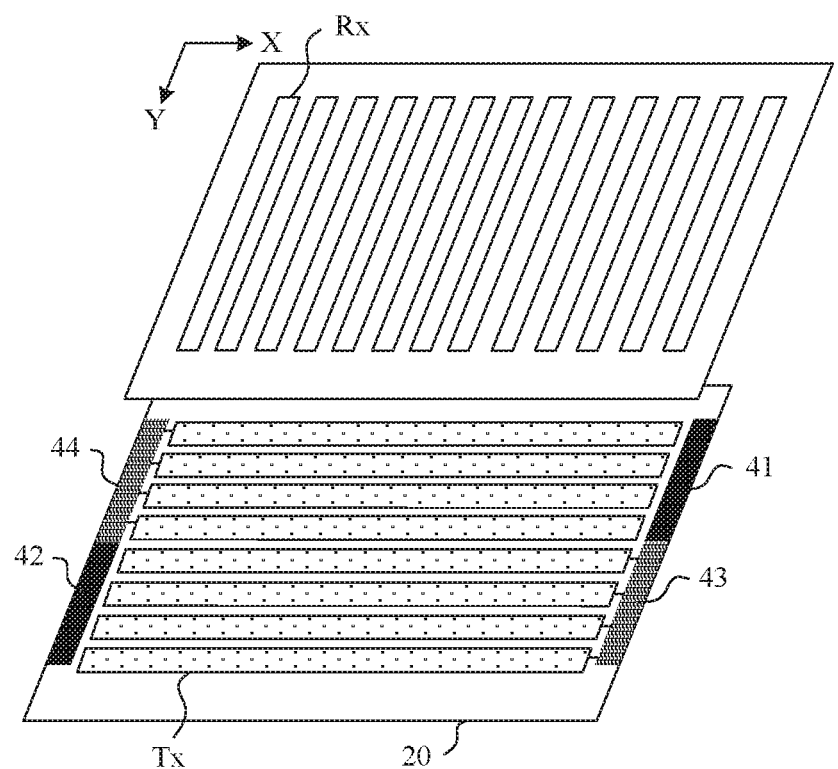
FIG. 8 is a schematic diagram of a display panel according to this application.

In addition, this application further provides another display panel, as shown in FIG. 8, including an array substrate, and a box-aligning substrate meshed with the array substrate together.

The array substrate includes a substrate 20, where a display area 30 and a non-display area 40 are disposed on the substrate 20; the display area 30 includes a first gate line group 31 and a second gate line group 32, both the first gate line group 31 and the second gate line group 32 include a plurality of gate lines 312 (refer to FIG. 4a for details) arranged along a first direction Y, and an extension direction of the gate lines 312 intersects with the first direction Y; the display area 30 further includes a first touch driving electrode group 33 and a second touch driving electrode group 34, both the first touch driving electrode group 33 and the second touch driving electrode group 34 include a plurality of touch driving electrodes Tx (refer to FIG. 4b for details) arranged along the first direction Y, and an extension direction of the touch driving electrodes Tx intersects with the first direction; the non-display area 40 includes a first gate driving circuit 41 and a second grate driving circuit 42, the first gate driving circuit 41 and the second gate driving circuit 42 are respectively disposed on two sides of the gate lines 312, the first gate driving circuit 41 is configured to drive the first gate line group 31, and the second gate driving circuit 42 is configured to drive the second gate line group 32; and the non-display area 40 further includes a first touch driving circuit 43 and a second touch driving circuit 44, where the first touch driving circuit 43 and the first gate driving circuit 41 are located on a same side and are disposed along the first direction Y the second touch driving circuit 44 and the second gate driving circuit 42 are located on a same side and disposed along the first direction Y, the first touch driving circuit 43 is configured to drive the first touch driving electrode group 33, and the second touch driving circuit 44 is configured to drive the second touch driving electrode group 34.

A plurality of touch sensing electrodes Rx arranged along a second direction X are disposed on an area of a display area 30 of the array substrate corresponding to the box-aligning substrate, and an extension direction of the touch sensing electrodes Rx intersects with the second direction X; and the first direction intersects with the second direction.

For the array substrate, refer to related descriptions of the foregoing array substrate which only includes the touch driving electrodes Tx, and details are not described herein again.

The touch driving electrodes Tx may be disposed in parallel with the gate lines 312, that is, both the gate lines 312 and the touch driving electrodes Tx extend along the second direction X; and the touch sensing electrodes Rx may be disposed in parallel with the data lines 35, that is, both the data lines 35 and the touch sensing electrodes Rx extend along the first direction Y The second direction X may be a horizontal direction, and the first direction Y may be a vertical direction.

It should be noted that, FIG. 8 only shows the touch sensing electrodes Tx, the first gate driving circuit 41, the second gate driving circuit 42, the first touch driving circuit 43, and the second touch driving circuit 44 on the array substrate, and remaining parts are not shown.

The touch sensing electrodes Rx may be disposed on a side away from the array substrate.

Figure 9:
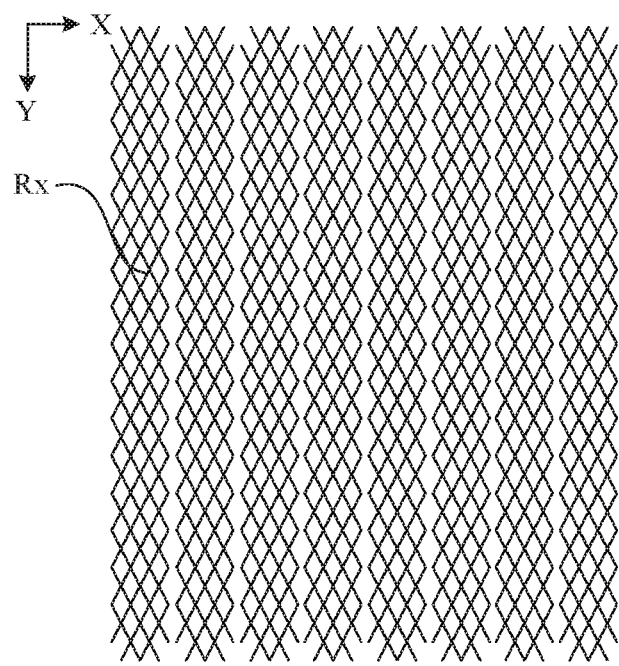
FIG. 9 is a schematic diagram of touch sensing electrodes according to this application.

Considering that when a material of the touch sensing electrodes Rx is a metal material, conductivity is better, and touch performance is better. Therefore, as shown in FIG. 9, the touch sensing electrodes Rx can be manufactured into a grid structure, and a material of the touch sensing electrodes Rx is a metal material.

A shape of a grid in the grid structure is a regular polygon or an irregular polygon. As shown in FIG. 9, a touch sensing electrode Rx is used as an example, where a plurality of metal lines intersect to form a plurality of grids, and for any grid, its shape may be a regular polygon or an irregular polygon.

A metallic material may be a metal element, an alloy, or the like. For example, a metallic material may be Ag (silver), Cu (copper), AI (aluminum), AlNb (AlNb alloy) alloy, or the like.

By manufacturing the touch sensing electrodes Rx into a grid structure, an impact on tight transmittance is small.

What is claimed is:

1. An array substrate, comprising:
   a substrate;
   a display area disposed on the substrate and comprising:
   a first gate line group comprising first gate lines extending in an X direction;
   a second gate line group comprising second gate lines extending in the X direction;
   a first touch driving electrode group comprising first touch driving electrodes extending in the X direction; and
   a second touch driving electrode group comprising second touch driving electrodes extending in the X direction; and
   a non-display area disposed on the substrate and comprising:
   a first gate driving circuit extending in a Y direction and disposed proximate to the first gate line group and configured to drive the first gate lines, wherein the Y direction is perpendicular to the X direction;
   a second gate driving circuit extending in the Y direction and disposed proximate to the second gate line group and configured to drive the second gate lines;
   a first touch driving circuit extending in the Y direction and disposed proximate to the first touch driving electrode group and configured to drive the first touch driving electrodes, wherein the first touch driving circuit and the first gate driving circuit are disposed in series; and
   a second touch driving circuit extending in the Y direction disposed proximate to the second touch driving electrode group and configured to drive the second touch driving electrodes, wherein the second touch driving circuit and the second gate driving circuit are disposed in series.

2. The array substrate of claim 1, wherein the first touch driving circuit and the first gate driving circuit are disposed on a first side of the gate lines, and wherein the second touch driving circuit and the second gate driving circuit are disposed on a second side of the gate lines, wherein the second side is opposite to the first side.

3. The array substrate of claim 1, wherein the first gate driving circuit is disposed above the first touch driving circuit, and wherein the second touch driving circuit is disposed above the second gate driving circuit.

4. The array substrate of claim 1, wherein the first touch driving circuit is disposed above the first gate driving circuit, and wherein the second gate driving circuit is disposed above the second touch driving circuit.

5. The array substrate of claim 1, wherein in a difference between a first quantity of the first gate lines and a second quantity of the second gate lines is less than or equal to one.

6. The array substrate of claim 1, wherein a difference between a first quantity of the first touch driving electrodes and a second quantity of the second touch driving electrodes is less than or equal to one.

7. The array substrate of claim 1, wherein a first shape of the first touch driving electrodes is a strip shape, and wherein a second shape of the second touch driving electrodes is the strip shape.

8. The array substrate of claim 1, wherein the display area further comprises a common electrode, and wherein the first touch driving electrodes and the second touch driving electrodes are multiplexed with the common electrode.

9. The array substrate of claim 1, wherein the display area further comprises a plurality of touch sensing electrodes, and wherein an extension direction of the touch sensing electrodes is the same as the extension direction of the first touch driving circuit.

10. A display panel comprising:
an array substrate comprising:
  a substrate;
  a display area disposed on the substrate comprising:
    a first gate line group comprising first gate lines extending in an X direction;
    a second gate line group comprising second gate lines extending in the X direction;
    a first touch driving electrode group comprising first touch driving electrodes extending in the X direction; and
    a second touch driving electrode group comprising second touch driving electrodes extending in the X direction; and
  a non-display area disposed on the substrate comprising:
    a first gate driving circuit extending in a Y direction and disposed proximate to the first gate line group and configured to drive the first gate lines, wherein the Y direction is perpendicular to the X direction;
    a second gate driving circuit disposed proximate to the second gate line group extending in the Y direction and configured to drive the second gate lines;
    a first touch driving circuit extending in the Y direction and disposed proximate to the first touch driving electrode group and configured to drive the first touch driving electrodes; and
    a second touch driving circuit extending in the Y direction and disposed proximate to the second touch driving electrode group and configured to drive the second touch driving electrodes, and wherein the second touch driving circuit and the second gate driving circuit are disposed in series.

11. The display panel of claim 10, wherein the first touch driving circuit and the first gate driving circuit are disposed on a first side of the gate lines, and wherein the second touch driving circuit and the second gate driving circuit are disposed on a second side of the gate lines, wherein the first side is opposite to the second side.

12. The display panel of claim 10, wherein the first gate driving circuit is disposed above the first touch driving circuit, and wherein the second touch driving circuit is disposed above the second gate driving circuit.

13. The display panel of claim 10, wherein the first touch driving circuit is disposed above the first gate driving circuit, and wherein the second gate driving circuit is disposed above the second touch driving circuit.

14. The display panel of claim 10, wherein a first shape of the first touch driving electrodes is a strip shape, and wherein a second shape of the second touch driving electrodes is the strip shape.

15. The display panel of claim 10, wherein the display area further comprises a common electrode, and wherein the first touch driving electrodes and the second touch driving electrodes are multiplexed with the common electrode.

16. The display panel of claim 10, wherein the display area further comprises a plurality of touch sensing electrodes, and wherein an extension direction of the touch sensing electrodes is the same as the extension direction of the first touch driving circuit.

17. An electronic device comprising:
an array substrate comprising:
  a substrate;
  a display area disposed on the substrate comprising:
    a first gate line group comprising first gate lines extending in an X direction;
    a second gate line group comprising second gate lines extending in the X direction;
    a first touch driving electrode group comprising first touch driving electrodes extending in the X direction; and
    a second touch driving electrode group comprising second touch driving electrodes extending in the X direction; and
  a non-display area disposed on the substrate comprising:
    a first gate driving circuit disposed in a Y direction and proximate to the first gate line group and configured to drive the first gate lines, wherein the Y direction is perpendicular to the X direction;
    a second gate driving circuit disposed in the Y direction and proximate to the second gate line group and configured to drive the second gate lines;
    a first touch driving circuit disposed in the Y direction and proximate to the first touch driving electrode group and configured to drive the first touch driving electrodes, wherein the first touch driving circuit and the first gate driving circuit are disposed in series; and
    a second touch driving circuit disposed in the Y direction and proximate to the second touch driving electrode group and configured to drive the second touch driving electrodes, wherein the second touch driving circuit and the second gate driving circuit are disposed in series.

18. The electronic device of claim 17, wherein the first touch driving circuit and the first gate driving circuit are disposed on a first side of the gate lines, and wherein the second touch driving circuit and the second gate driving circuit are disposed on a second side of the gate lines, wherein the first side is opposite to the second side.

19. The electronic device of claim 17, wherein the first gate driving circuit is disposed above the first touch driving circuit, and wherein the second touch driving circuit is disposed above the second gate driving circuit.

20. The electronic device of claim 17, wherein the first touch driving circuit is disposed above the first gate driving circuit, wherein the second gate driving circuit is disposed above the second touch driving circuit is disposed below the second gate driving circuit.

* * * * *

UNITED STATES PATENT AND TRADEMARK OFFICE
CERTIFICATE OF CORRECTION

PATENT NO. : 10,955,979 B2  
APPLICATION NO. : 16/650082  
DATED : March 23, 2021  
INVENTOR(S) : Yanfeng Liang, Chunlang Pu and Kangjie Chao Page 1 of 1

It is certified that error appears in the above-identified patent and that said Letters Patent is hereby corrected as shown below:

In the Claims

Claim 20, Column 15, Line 10: "above the second touch driving circuit is disposed below the second gate driving circuit." should read "above the second touch driving circuit."

Signed and Sealed this  
Twenty-seventh Day of April, 2021

Drew Hirshfeld  
*Performing the Functions and Duties of the*  
*Under Secretary of Commerce for Intellectual Property and*  
*Director of the United States Patent and Trademark Office*